(12) United States Patent
Chin et al.

(10) Patent No.: US 9,431,568 B2
(45) Date of Patent: Aug. 30, 2016

(54) OPTICAL RECEIVER METHOD AND APPARATUS

(71) Applicant: Quantum Electro Opto Systems Sdn. Bhd., Melaka (MY)

(72) Inventors: Teyo Tuan Chin, Selangor (MY); Gabriel Walter, Melaka (MY)

(73) Assignee: Quantum Electro Opto Systems Sdn. Bhd., Melaka (MY)

( * ) Notice: Subject to any disclaimer, the term of this patent is extended or adjusted under 35 U.S.C. 154(b) by 261 days.

(21) Appl. No.: 14/290,467

(22) Filed: May 29, 2014

(65) Prior Publication Data

US 2014/0353529 A1    Dec. 4, 2014

Related U.S. Application Data

(60) Provisional application No. 61/956,046, filed on May 30, 2013.

(51) Int. Cl.

| G02B 6/36 | (2006.01) |
|---|---|
| H01L 31/18 | (2006.01) |
| G02B 6/42 | (2006.01) |
| H01L 31/0203 | (2014.01) |

(52) U.S. Cl.
CPC .............. *H01L 31/18* (2013.01); *G02B 6/423* (2013.01); *G02B 6/4274* (2013.01); *G02B 6/4292* (2013.01); *G02B 6/4295* (2013.01); *H01L 31/0203* (2013.01); *Y10T 29/41* (2015.01)

(58) Field of Classification Search
CPC ......................... G02B 6/4201; G02B 6/42901
USPC ..................................................... 385/92, 88
See application file for complete search history.

(56) References Cited

U.S. PATENT DOCUMENTS

| 6,517,258 B1 | 2/2003 | Keska et al. ..................... 385/92 |
| 2002/0057883 A1 | 5/2002 | Malone et al. ............... 385/136 |
| 2002/0098609 A1 | 7/2002 | Ono et al. ........................ 438/31 |
| 2002/0197025 A1 | 12/2002 | Vaganov et al. ................ 385/92 |
| 2004/0028349 A1 | 2/2004 | Nagasaka et al. .............. 385/88 |

(Continued)

FOREIGN PATENT DOCUMENTS

| JP | 2009-151053 | 9/2009 |
| JP | 2010-271444 | 12/2010 |

*Primary Examiner* — Thanh Luu
(74) *Attorney, Agent, or Firm* — Martin Novack

(57) ABSTRACT

A method for making an optical receiver assembly that can receive optical signals via an input optical fiber and can generate output electrical signals, including the following steps: providing an open-ended cavity formed of insulating material, such as a ceramic, comprising a base, peripheral sidewalls, and an open end opposite the base, the outside surface of the base defining a first surface and the inside surface of the base defining a second surface; disposing a first conductive region on a portion of the first surface and a second conductive region on a portion of the second surface; mounting, on the first surface, a semiconductor photodetector device having an active region for communicating optically with the input optical fiber, and coupling an electrical output of the photodetector device with the first conductive region; mounting, on the second surface, an amplifier that is electrically coupled with the second conductive region and produces the output electrical signals; and providing at least one conductive via through the thickness of the base and between the first and second conductive regions for coupling the electrical output of the photodetector device with the amplifier.

27 Claims, 4 Drawing Sheets

(56) References Cited

U.S. PATENT DOCUMENTS

| | | | |
|---|---|---|---|
| 2005/0018975 A1* | 1/2005 | Ho | G02B 6/4202 385/88 |
| 2005/0185882 A1 | 8/2005 | Zack et al. | 385/15 |
| 2011/0317965 A1 | 12/2011 | Fujimura et al. | 385/93 |
| 2014/0233887 A1 | 8/2014 | Rahmat et al. | 385/33 |

* cited by examiner

OPTICAL RECEIVER METHOD AND APPARATUS

PRIORITY CLAIM

Priority is claimed from U.S. Provisional Patent Application No. 61/956,046, filed May 30, 2013, and said Provisional Patent Application is incorporated herein by reference.

FIELD OF THE INVENTION

This invention relates to the field of fiber optical communication systems and techniques and, more particularly, to an optical receiver apparatus and method that has attributes of improved manufacturability and operation.

BACKGROUND OF THE INVENTION

Fiber optical communication systems are in widespread use, and it is important that such systems have optical receiver subsystems that can be manufactured efficiently and inexpensively, and which do not compromise the high speed capability of the communication system.

One aspect of optical receiver design involves minimizing parasitic inductance that arises, in high frequency operation, when conductor length (such as circuit wiring) is relatively long. To control parasitic inductance, the length of electrical conductive path between the connection points for the components has to be minimized in order to reduce the inductance effect.

Also, free space passive alignment at the receiver between a photodetector (typically, a photodiode) and the distal end of the optical fiber, for low cost assembly, is a challenge in a system without a lens, due to the divergence nature of the light exiting from the optical fiber. Direct coupling that allows the surface of the optical fiber to mate to the surface of the active area of, for example, a back-illuminated photodiode, is desired to optimize the light coupling efficiency. However, the back-illuminated photodiode requires the chip to be flipped and attached on an extended electrically conductive path for wire bonding from a transimpedance amplifier (TIA). This increases the conductive path length from photodiode to TIA, resulting in additional inductance. Moreover, the direct coupling design requires a clearance of an area equivalent to at least the fiber ferrule diameter, making the design to shorten the conductive path between TIA and the photodiode become a challenge when photodiode and the TIA are mounted on the same plane.

Furthermore, if all the components are incorporated on the same plane, the area required per unit substrate increases substantially, and this can greatly increase the unit cost of the receiver subassembly.

It is among the objectives of the invention to overcome these and other problems and limitations of prior art equipments and techniques, and to provide optical receivers and techniques that exhibit attributes of improved manufacturability and operation.

SUMMARY OF THE INVENTION

In accordance with a feature of an embodiment of the invention, an insulating (preferably, ceramic) substrate has layers of metallization on a respective plurality of planes (for example, three planes). The planes are interconnected through a plurality of metallized vias, wherein the metallized vias can serve as AC signal, ground, and power interconnects among the planes. A top plane can provide a plurality of conductive paths for attachment of a photodiode chipset and for interconnecting to the bottom planes through the vias. A receptacle can be aligned to a photodiode and secured to the top plane for guiding a ferrule with an optical fiber attached to its center. The bottom plane of the substrate can comprise a plurality of conductive paths for attachment of a transimpedance amplifier (TIA) and passive components. A third plane is also provided and can be used, inter alia, for input/output connection.

Existing manufacture using vias and double plane component mounting employs, for example printed circuit board (PCB). However, the metallization on PCB is not able to achieve the conductor width, conductor pitch and pad dimension as small as can be achieved with ceramic. Furthermore, PCB has warpage issues and is not as flat as ceramic panel. Moreover, PCB cannot be singulated into a size as small as a ceramic.

In accordance with a form of the invention, a method is set forth for making an optical receiver assembly that can receive optical signals via an input optical fiber and can generate output electrical signals, including the following steps: providing an open-ended cavity formed of insulating material, such as a ceramic, comprising a base, peripheral sidewalls, and an open end opposite said base, the outside surface of the base defining a first surface and the inside surface of the base defining a second surface; disposing a first conductive region on a portion of said first surface and a second conductive region on a portion of said second surface; mounting, on said first surface, a semiconductor photodetector device having an active region for communicating optically with the input optical fiber, and coupling an electrical output of the photodetector device with said first conductive region; mounting, on said second surface, an amplifier that is electrically coupled with said second conductive region and produces said output electrical signals; and providing at least one conductive via through the thickness of said base and between said first and second conductive regions for coupling the electrical output of said photodetector device with said amplifier.

A preferred embodiment of this form of the invention further comprises precision mounting a tubular receptacle on said first surface enclosing said photodetector device (which can be, for example, a back-illuminated photodiode or phototransistor), providing an encasing ferrule on the tip of said input optical fiber, and inserting said ferrule-encased optical fiber in said receptacle, such that the end of said optical fiber communicates optically with said active region of said photodetector device. In this embodiment, the step of mounting an amplifier on said second surface comprises mounting a transimpedance amplifier on said second surface. Also in this embodiment said second conductive region is segmented and coupled with electronic components mounted on said second surface, and the method further comprises providing shelf conductor segments on the planar shelf of said peripheral sidewalls of said cavity, and providing conductive vertical sidewall vias through said sidewalls for coupling segments of said second conductive region with respective shelf conductor segments. (In an optional variation of this embodiment, conductor-coated slots are provided on the sidewall shelf of said cavity, and said transimpedance amplifier on said second surface is wire coupled with said conductor-coated slots.) A feature of this embodiment further comprises providing a circuit board having conductors thereon, and connecting said cavity and said circuit board with shelf conductor segments of said cavity contacting conductors on said circuit board.

In accordance with another form of the invention, an optical receiver assembly is set forth that receives optical signals via an input optical fiber and generates output electrical signals, and comprises: an open-ended cavity formed of an insulating material, comprising a base, peripheral sidewalls, and an open end opposite said base, the outside surface of said base defining a first surface and the inside surface of said base defining a second surface; a first conductive region disposed on a portion of said first surface and a second conductive region disposed on a portion of said second surface; a semiconductor photodetector device having an active region for communicating optically with said input optical fiber, mounted on said first surface, an electrical output of said photodetector device being coupled with said first conductive region; an amplifier, mounted on said second surface, that is electrically coupled with said second conductive region and operative to produce said output electrical signals; and at least one conductive via through the thickness of said base and between said first and second conductive regions for coupling the electrical output of said photodetector device with said amplifier.

In accordance with a further form of the invention, a method is set forth for making an optical receiver assembly that can receive optical signals via an input optical fiber and generate output electrical signals, comprising the following steps: providing an open-ended cavity formed of insulating material comprising a base, peripheral sidewalls, and an open end opposite said base, the planar outside surface of said base defining a first surface, the planar inside surface of said base defining a second surface, and a planar shelf at the terminus of the peripheral sidewalls defining a third surface; disposing at least one conductive region on said first surface, disposing a plurality of conductive regions on said second surface, and disposing another plurality of conductive regions on said third surface; providing conductive vias, through the insulating material of said cavity between said first and second surfaces, between said first and third surfaces, and between said second and third surfaces, and electrically coupling at least some of the conductive regions on each of said surfaces with the conductive vias at said surfaces; mounting, on said first surface, a semiconductor photodetector device having an active region for communicating optically with said input optical fiber, and coupling an electrical output of said photodetector device with said at least one conductive region disposed on said first surface; and mounting, on said second surface, electrical circuitry coupled with the conductive regions disposed on said second surface; whereby electrical signals related to the electrical output of said photodetector device are coupled via said electrical circuitry to the plurality of conductive regions on said third surface.

An advantage of an embodiment of the invention is the support for high frequency operation, thanks to the shorter conductive path that interconnect the photodiode on the top plane to the TIA and circuitry at the opposite side of the bottom plane through the metallized vias and conductive segments. This shorter path length between photodiode and TIA reduces the inductance and thus enhances the bandwidth of the receiver.

Another advantage involves the design split between the low precision and high precision placement of components onto bottom and top planes, respectively. Low precision placement involving TIA and passive components is done on the bottom plane whereas high precision placement involving photodiode to fiber receptacle alignment is done on the top plane. The method hereof releases the capacity of the high precision placement machine from low precision placement steps, thus increasing the throughput (and reducing cost) of the high precision placement equipment.

Also, components interconnected vertically between top plane and bottom plane save substantially the area per unit substrate in the horizontal plane and increase the area available for other components.

In one disclosed embodiment, the area per unit substrate is shrunk down further by incorporating slot openings on the cavity sidewall shelf for wire bonding directly to conductive pads on slot surfaces from the TIA. As will be described, this serves to reduce the length of conductive paths at the bottom plane from components to the third surface.

Further features and advantages of the invention will become more readily apparent from the following detailed description when taken in conjunction with the accompanying drawings.

BRIEF DESCRIPTION OF THE DRAWINGS

FIG. 7, which includes

DETAILED DESCRIPTION

Figure 1:
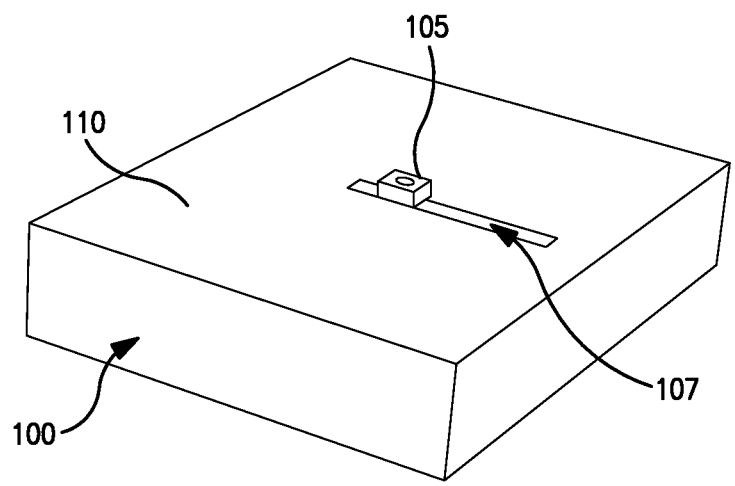
FIG. 1 is a top perspective view of a ceramic cavity which is part of an optical receiver apparatus in accordance with an embodiment of the invention and which can be made in accordance with an embodiment of the method of the invention.
Figure 2:
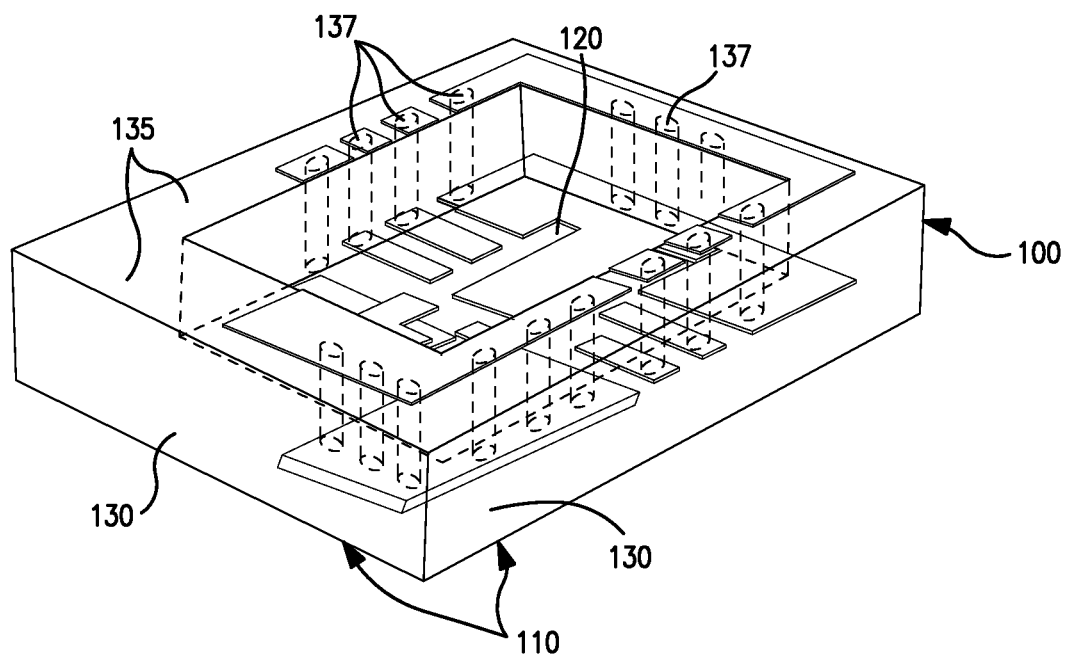
FIG. 2 is a bottom perspective see-through view of the ceramic cavity of the FIG. 1 embodiment, showing representative conductive vertical vias and representative segments of conductive regions.

FIGS. 1 and 2 show an embodiment of an optical receiver apparatus in accordance with an embodiment of the invention and which is illustrative of an embodiment of the method of the invention. An open-ended cavity 100, is formed of an insulating material such as a ceramic. In the illustrated embodiment, the outer locus of the cavity is generally in the shape of a three-dimensional parallelepiped and includes a base having an outside surface 110, an inside surface 120, and peripheral sidewalls represented at 130. At the open end of the cavity, the sidewalls 130 terminate at a planar sidewall shelf 135.

In the present embodiment, there are three planes on which conductive metallization regions (which may be strips or segments thereof) are applied. For reference, the outside surface 110 of the base is referred to as the "first surface", and it defines one of the planes which is called the top plane. The inside surface of the base is referred to as the "second surface", and it defines another of the planes which is called the bottom plane. The planar shelf 135 of the sidewalls defines the third plane, which is sometimes referred to as the "extended plane".

In the embodiment of FIGS. 1 and 2, the cylindrical regions 137, shown in dashed line, represent the locations of exemplary conductive vias. A conductive metal material can fill all or part of the indicated region, as desired, to achieve electrical connections between respective conductive regions on the top plane, the bottom plane, and/or the extended plane.

As illustrated in FIG. 1, a photodetector (photodiode module 105, in this embodiment) is mounted on the top plane (outside surface 110 of the cavity base), and metal conductive region 107 is deposited on the surface 110 and contacts a conductive via (not shown in FIG. 1) which effects coupling to the circuitry on the bottom plane (inside surface 120 of the cavity base).

Figure 3:
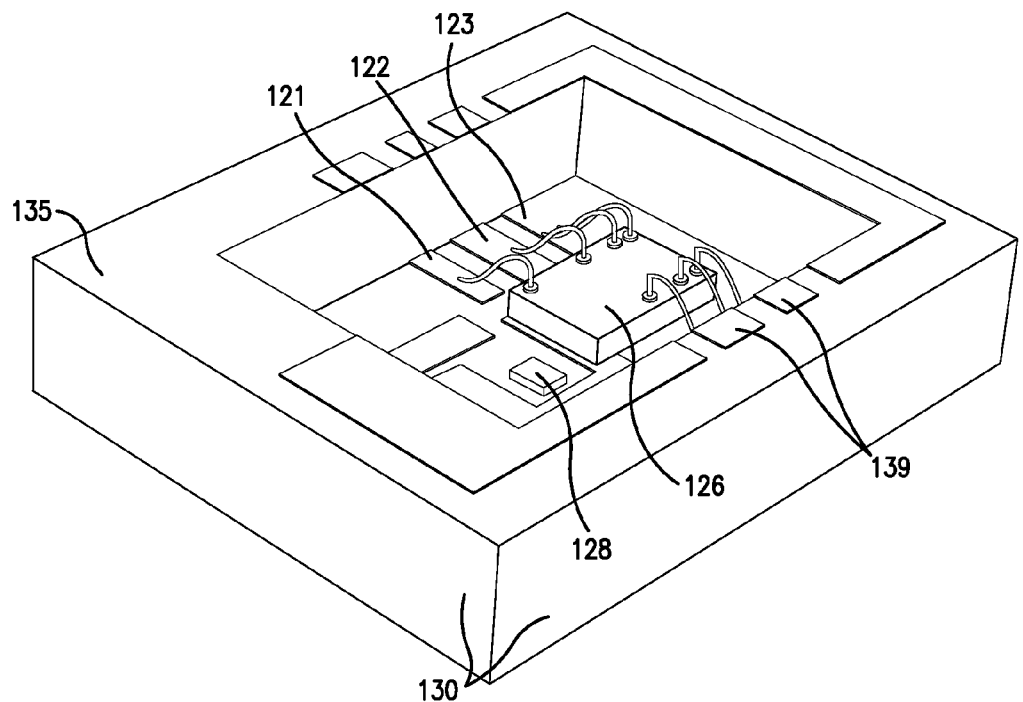
FIG. 3 is another bottom perspective view of the ceramic cavity, showing representative circuitry and segments of conductive regions.

FIG. 3 shows the open end of the cavity, as in FIG. 2, but with representative electronic circuitry mounted on the bottom plane (the inside surface 120 of the base), and representative segments of metal conductive region deposited on the bottom plane, for example at 121, 122, and 123. The electronic circuitry typically includes a transimpedance amplifier (TIA) 126, and passive components, represented generally at 128. As seen in the Figure, the transimpedance amplifier and the passive components are wire coupled with the conductive segments disposed on the bottom plane. The conductive paths continue through the vias to both the top plane (for connection with the photodiode module) and the extended plane (for connection with the conductive segments 139 on the sidewall shelf). Then, in turn, coupling from the shelf conductor segments can be effected to, for example, a printed circuit board, as described hereinbelow in conjunction with FIG. 7.

Figure 4:
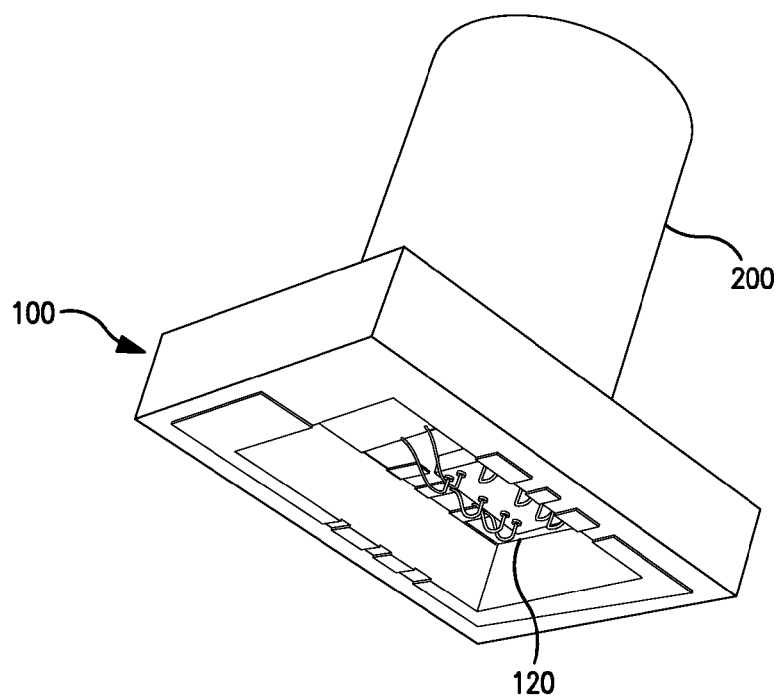
FIG. 4 is a side perspective view of an optical receiver apparatus in accordance with an embodiment of the invention and which can be made in accordance with an embodiment of the method of the invention.
Figure 5:
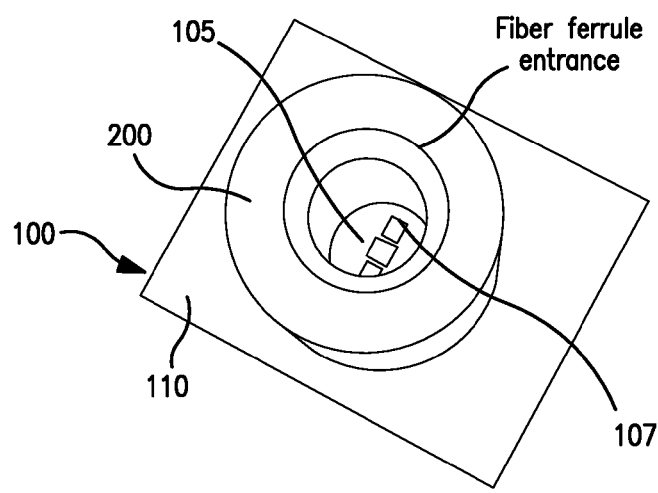
FIG. 5 another perspective view of the FIG. 4 apparatus, showing the entrance to the receptacle that receives the optical fiber ferrule.

FIGS. 4 and 5 show the tubular receptacle 200 that is mounted on the top plane 110 of the cavity 100 over the photodiode module 105. A ferrule at the end of the optical fiber fits in the receptacle so that light propagating in the fiber is coupled efficiently into the photodiode of module 105. A technique for positioning and securing the receptacle with high precision is disclosed in U.S. patent application Ser. No. 13/924,943, filed Jun. 24, 2013, published as U.S. Patent Application Publication No. US2014/0233887, assigned to the same assignee as the present Application. As seen in FIG. 4, the electronic components, including the TIA and passive components, are mounted on the bottom plane (inside surface) 120 of the cavity, as previously described. Although the receptacle must be aligned to the photodiode with high precision, an advantage of the disclosed configuration is that no high precision alignment is required when attaching the components at the bottom plane. The invention thus releases the capacity of the high precision placement machine from low precision placement steps, thereby increasing throughput (and reducing cost) of the high precision placement machine. Also, as previously described, the TIA 126 can be connected to the photodiode through a metalized via vertically, thereby shortening the conductive path and contributing to the reduction of the footprint of the fabricated optical receiver unit. In the top view of FIG. 5, the photodiode module 105 and the conductive strip 107 are visible through the aperture of the aligned receptacle 200, which receives the fiber ferrule.

Figure 6:
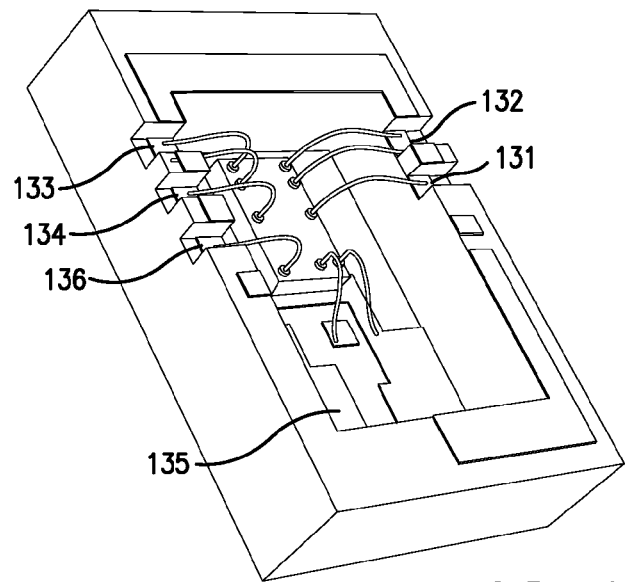
FIG. 6 is a bottom perspective view of another form of an optical receiver apparatus in accordance with an embodiment of the invention and which can be made in accordance with an embodiment of the method of the invention.

FIG. 6 illustrates an optional feature of an embodiment of the invention wherein the sidewall shelf 135 of the cavity 100 is provided with a plurality of slots which can be used as wire landings for wire coupling with components mounted on the bottom plane, that is, the inner surface 120 of the cavity base. The slots can have conductive metal disposed thereon (which can be stepped to the extended plane of sidewall shelf 135), and wiring can be conveniently bonded to these metallized slots. For example, in FIG. 6, wiring from the transimpedance amplifier (TIA) is shown as being bonded to metallized slots 131, 132, 133, 134, and 136. The described feature has an advantage of reducing the "footprint" of each manufactured receiver subassembly by eliminating additional clearance that would otherwise be necessary for insertion of a wire bonding tool within the cavity sidewalls. By using the sidewall slots for wire bonding, the gap between components and cavity sidewalls can be reduced, without concern for the wire bonding nozzle hitting the components and/or cavity sidewall.

Figure 7A:
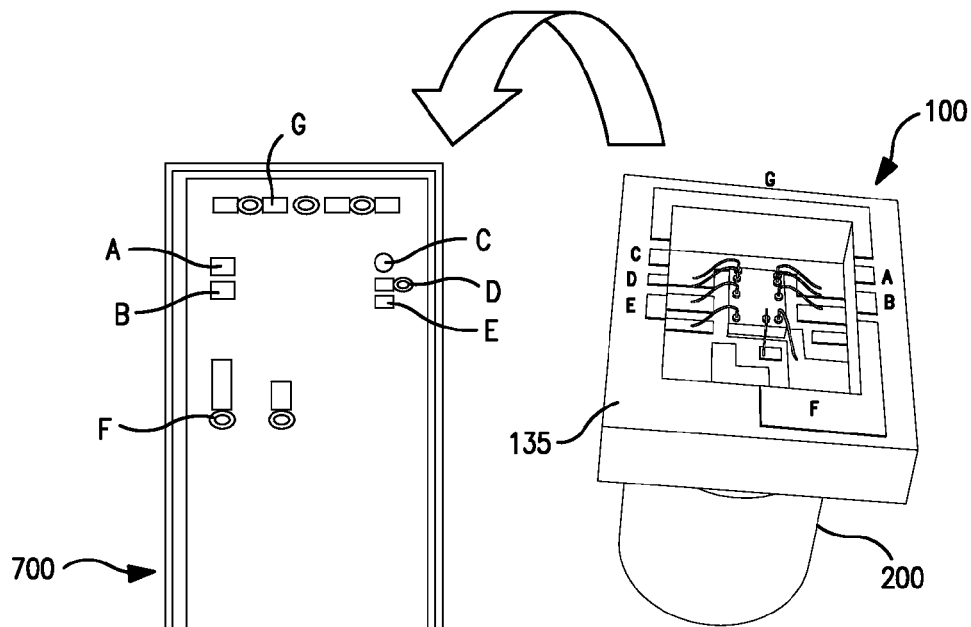
FIGS. 7A and 7B, illustrates how the ceramic cavity optical receiver can be attached to a circuit board.
Figure 7B:
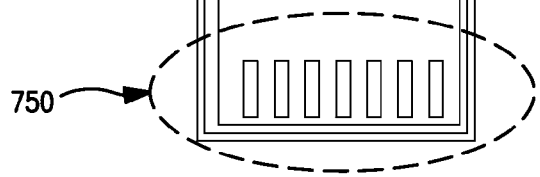

FIG. 7, which includes FIG. 7A and FIG. 7B, shows how the fabricated ceramic cavity receiver assembly can be mounted, for example, on a circuit board for convenient electrical input/output connection. The FIG. 7A shows the ceramic cavity (100) receiver assembly with the optical receptacle 200, and the FIG. 7B shows the circuit board 700 which can be, for example, a printed board or flexible circuit. The circuit board has representative conductive pads labeled A, B, C, D, E, F, G, which correspond positionally with conductive segments having the same letters on the sidewall shelf 135 of ceramic cavity 100. Conductive epoxy is disposed on the pads of the board 700, and the ceramic cavity, with attached receptacle, is flipped and attached on the circuit board, followed by heat curing. The electrical input/output, coupled with the lettered pads, is represented at 750.

Figure 8:
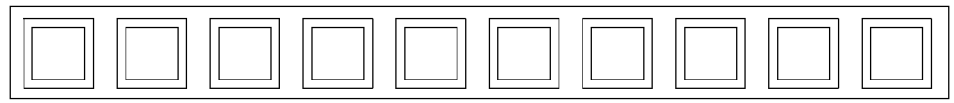
FIG. 8 shows an example of ten ceramic cavity units in strip form, before addition of components and singulation.

FIG. 8 shows an example of a molded ceramic substrate strip, made from a low temperature co-fired ceramic (LTCC) process, comprising ten formed ceramic cavity units, with conductive regions and conductive vias (not visible in this Figure), for subsequent singulation. (A substrate panel with a two-dimensional array of ceramic cavity units can alternatively be used as a starting source.) An example of the assembly processing procedure of an embodiment hereof is as follows: 1. Conductive epoxies are applied to the pads on the second surface of each unit of the substrate; 2. The TIA and other electronic components are attached to each unit, followed by heat curing; 3. The TIA is wire bonded to conductive strips on the bottom plane (or, alternatively, wired to shelf slots); 4. The strip is singulated to individual units; 5. Each unit is flipped over for photodiode module attachment (e.g. using conductive epoxy) on the top plane, followed by heat curing; 6. The ferrule receptacle is aligned and then mounted in place; and the ceramic cavity assembly is mounted on the circuit board. Then, the completed optical receiver assembly is ready for insertion of the optical fiber ferrule and the electrical input/output connections.

The invention claimed is:

1. A method for making an optical receiver assembly that can receive optical signals via an input optical fiber and can generate output electrical signals, comprising the steps of:

providing an open-ended cavity formed of insulating material, comprising a base, peripheral sidewalls, and an open end opposite said base, the outside surface of said base defining a first surface and the inside surface of said base defining a second surface;

disposing a first conductive region on a portion of said first surface and a second conductive region on a portion of said second surface;

mounting, on said first surface, a semiconductor photodetector device having an active region for communicating optically with said input optical fiber, and coupling an electrical output of said photodetector device with said first conductive region;

mounting, on said second surface, an amplifier that is electrically coupled with said second conductive region and produces said output electrical signals; and providing at least one conductive via through the thickness of said base and between said first and second conductive regions for coupling the electrical output of said photodetector device with said amplifier.

2. The method as defined by claim 1, wherein said step of providing an open-ended cavity formed of insulating material comprises providing an open-ended cavity formed of a ceramic material.

3. The method as defined by claim 1, further comprising mounting a tubular receptacle on said first surface enclosing said photodetector device, providing an encasing ferrule on the tip of said input optical fiber, and aligning said ferrule-encased optical fiber in said receptacle, such that the end of said optical fiber communicates optically with said active region of said photodetector device.

4. The method as defined by claim 3, wherein said step of mounting a semiconductor photodetector device comprises mounting a photodiode or phototransistor.

5. The method as defined by claim 3, wherein said step of mounting said semiconductor photodetector device comprises mounting a back-illuminated photodiode or phototransistor, and wherein said ferrule-encased optical fiber communicates optically with said photodiode or phototransistor.

6. The method as defined by claim 1, wherein said step of mounting an amplifier on said second surface comprises mounting a transimpedance amplifier on said second surface.

7. The method as defined by claim 1, wherein said second conductive region is segmented and coupled with electronic components mounted on said second surface, and further comprising providing shelf conductor segments on the planar shelf of said peripheral sidewalls of said cavity, and further comprising providing conductive vertical sidewall vias through said sidewalls for coupling segments of said second conductive region with respective shelf conductor segments.

8. The method as defined by claim 6, further comprising providing conductor-coated slots on the sidewall shelf of said cavity, and wire coupling said transimpedance amplifier on said second surface with said conductor-coated slots.

9. The method as defined by claim 7, further comprising: providing a circuit board having conductors thereon, and connecting said cavity and said circuit board with shelf conductor segments of said cavity contacting conductors on said circuit board.

10. An optical receiver assembly that receives optical signals via an input optical fiber and generates output electrical signals, comprising:

an open-ended cavity formed of an insulating material, comprising a base, peripheral sidewalls, and an open end opposite said base, the outside surface of said base defining a first surface and the inside surface of said base defining a second surface;

a first conductive region disposed on a portion of said first surface and a second conductive region disposed on a portion of said second surface;

a semiconductor photodetector device having an active region for communicating optically with said input optical fiber, mounted on said first surface, an electrical output of said photodetector device being coupled with said first conductive region;

an amplifier, mounted on said second surface, that is electrically coupled with said second conductive region and operative to produce said output electrical signals; and at least one conductive via through the thickness of said base and between said first and second conductive regions for coupling the electrical output of said photodetector device with said amplifier.

11. The optical receive assembly as defined by claim 10, wherein said insulating material comprises a ceramic.

12. The optical receiver assembly as defined by claim 10, further comprising a tubular receptacle on said first surface and enclosing said photodetector device, and a ferrule encasing the tip of said input optical fiber, said ferrule-encased optical fiber being aligned in said receptacle, such that the end of said optical fiber communicates optically with said active region of said photodetector device.

13. The optical receiver assembly as defined by claim 10, wherein said semiconductor photodetector device comprises a photodiode or phototransistor.

14. The optical receiver assembly as defined by claim 10, wherein said semiconductor photodetector device comprises a back-illuminated photodiode or phototransistor, said ferrule-encased optical fiber communicating optically with said photodiode or phototransistor.

15. The optical receiver assembly as defined by claim 10, wherein said amplifier comprises a transimpedance amplifier.

16. The optical receiver assembly as defined by claim 10, wherein said second conductive region is segmented and coupled with electronic components mounted on said second surface, and further comprising shelf conductor segments on the planar shelf of said peripheral sidewalls of said cavity, and further comprising conductive vertical sidewall vias through said sidewalls for coupling segments of said second conductive region with respective shelf conductor segments.

17. The optical receiver assembly as defined by claim 15, further comprising conductor-coated slots on sidewall shelf of said cavity, and wires coupling said transimpedance amplifier on said second surface with said conductor-coated slots.

18. A method of making an optical receiver assembly that can receive optical signals via an input optical fiber and generate output electrical signals, comprising the steps of:

providing an open-ended cavity formed of insulating material comprising a base, peripheral sidewalls, and an open end opposite said base, the planar outside surface of said base defining a first surface, the planar inside surface of said base defining a second surface, and a planar shelf at the terminus of the peripheral sidewalls defining a third surface;

disposing at least one conductive region on said first surface, disposing a plurality of conductive regions on said second surface, and disposing another plurality of conductive regions on said third surface;

providing conductive vias, through the insulating material of said cavity between said first and second surfaces, between said first and third surfaces, and between said second and third surfaces, and electrically coupling at least some of the conductive regions on each of said surfaces with the conductive vias at said surfaces;

mounting, on said first surface, a semiconductor photodetector device having an active region for communicating optically with said input optical fiber, and coupling an electrical output of said photodetector device with said at least one conductive region disposed on said first surface; and mounting, on said second surface, electrical circuitry coupled with the conductive regions disposed on said second surface;

whereby electrical signals related to the electrical output of said photodetector device are coupled via said electrical circuitry to the plurality of conductive regions on said third surface.

19. The method as defined by claim 18, wherein said step of providing an open-ended cavity formed of insulating material comprises providing an open-ended cavity formed of a ceramic material.

20. The method as defined by claim 18, further comprising mounting a tubular receptacle on said first surface enclosing said photodetector device, providing an encasing ferrule on the tip of said input optical fiber, and aligning said ferrule-encased optical fiber in said receptacle, such that the end of said optical fiber communicates optically with said active region of said photodetector device.

21. The method as defined by claim 18, further comprising providing conductor-coated slots on the sidewall shelf of said cavity, and wire coupling electrical circuitry on said second surface with said conductor-coated slots.

22. The method as defined by claim 18, further comprising: providing a circuit board having conductors thereon, and connecting said cavity and said circuit board with shelf conductor segments of said cavity contacting conductors on said circuit board.

23. An optical receiver assembly that receives optical signals via an input optical fiber and generates output electrical signals, comprising:

an open-ended cavity formed of insulating material and comprising a base, peripheral sidewalls, and an open end opposite said base, the planar outside surface of said base defining a first surface, the planar inside surface of said base defining a second surface, and a planar shelf at the terminus of the peripheral sidewalls defining a third surface;

at least one conductive region disposed on said first surface, a plurality of conductive regions disposed on said second surface, and another plurality of conductive regions disposed on said third surface;

conductive vias, through the insulating material of said cavity between said first and second surfaces, between said first and third surfaces, and between said second and third surfaces, and electrically coupling at least some of the conductive regions on each of said surfaces with the conductive vias at said surfaces;

a semiconductor photodetector device mounted on said first surface and having an active region for communicating optically with said input optical fiber, an electrical output of said photodetector device being coupled with said at least one conductive region disposed on said first surface; and electrical circuitry mounted on said second surface and being coupled with the conductive regions disposed on said second surface;

whereby electrical signals related to the electrical output of said photodetector device are coupled via said electrical circuitry to the plurality of conductive regions on said third surface.

24. The optical receiver assembly as defined by claim 23, wherein said insulating material comprises a ceramic material.

25. The optical receiver assembly as defined by claim 23, further comprising a tubular receptacle on said first surface and enclosing said photodetector device, and a ferrule encasing the tip of said input optical fiber, said ferrule-encased optical fiber being aligned in said receptacle, such that the end of said optical fiber communicates optically with said active region of said photodetector device.

26. The optical receiver assembly as defined by claim 23, further comprising conductor-coated slots on sidewall shelf of said cavity, and wires coupling said transimpedance amplifier on said second surface with said conductor-coated slots.

27. The optical receiver assembly as defined by claim 23, further comprising a circuit board having conductors thereon, said cavity and said circuit board being connected with shelf conductor segments of said cavity contacting conductors on said circuit board.

* * * * *